(12) United States Patent
Kato

(10) Patent No.: US 7,672,575 B2
(45) Date of Patent: Mar. 2, 2010

(54) EVAPORATOR FEATURING ANNULAR RIDGE MEMBER PROVIDED ON SIDE WALL SURFACE OF EVAPORATING CHAMBER

(75) Inventor: Yoshitake Kato, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 538 days.

(21) Appl. No.: 11/593,110

(22) Filed: Nov. 6, 2006

(65) Prior Publication Data
US 2007/0151518 A1   Jul. 5, 2007

(30) Foreign Application Priority Data
Nov. 7, 2005   (JP)   ............... 2005-322412

(51) Int. Cl.
*A01G 13/06* (2006.01)
(52) U.S. Cl. .................. 392/386; 392/389; 392/392
(58) Field of Classification Search .................. None
See application file for complete search history.

(56) References Cited
U.S. PATENT DOCUMENTS
2005/0011448 A1* 1/2005 Iwata ................. 118/715

FOREIGN PATENT DOCUMENTS
| JP | 2001-011634 | 1/2001 |
|----|-------------|--------|
| JP | 2005-039120 | 2/2005 |
| JP | 2005-109349 | 4/2005 |

* cited by examiner

Primary Examiner—Thor S Campbell
(74) Attorney, Agent, or Firm—McGinn IP Law Group, PLLC

(57) ABSTRACT

In an evaporator for evaporating mists of liquid raw material to thereby generate start gas for layer-formation, an evaporator body has an evaporator chamber defined therein, and a mist supply throat for introducing the mists into the evaporating chamber. The evaporator chamber is defined by a principal evaporating face which opposes to the mist supply throat. The evaporator body also has a start-gas supply passage which is formed therein between the mist supply throat and the principal evaporating face such that the start gas flows out of the evaporating chamber through the start-gas supply passage. A ridge member is provided on an inner side wall surface of the evaporating chamber between the start-gas is supply passage and the principal evaporating face so that a tip edge of the ridge member is directed to the principal evaporating face.

20 Claims, 9 Drawing Sheets

EVAPORATOR FEATURING ANNULAR RIDGE MEMBER PROVIDED ON SIDE WALL SURFACE OF EVAPORATING CHAMBER

BACKGROUND OF THE INVENTION

1. Field of the Invention

The present invention relates to an evaporator for evaporating a liquid raw material to thereby generate a start gas used in a layer-formation apparatus such as a chemical vapor deposition (CVD) apparatus, a metal organic chemical vapor deposition (MOCVD) apparatus, an atomic layer deposition (ALD) apparatus or the like.

2. Description of the Related Art

For example, JP2005-039120 A discloses a prior art evaporator which generates a start gas used to form a metal oxide layer on a semiconductor wafer such as a silicon wafer in a layer-formation apparatus.

The evaporator includes an evaporating chamber defined therein, and an atomizer for atomizing a liquid raw material containing a suitable solvent component and an organic metal component with a carrier gas to thereby produce a plurality of fine liquid-phase particles or mists. The mists are introduced into the evaporating chamber, and then are thermally evaporated to thereby generate the start gas, which is fed from the evaporating chamber to the layer-formation apparatus through a start-gas supply passage formed in the evaporator.

When the mists cannot be completely evaporated in the evaporating chamber, a part of the excess mists is entrained with the start gas fed to the layer-formation apparatus, and the entrained mists cause mist defects on a layer to be formed on the semiconductor wafer in the layer-formation apparatus. Thus, the entrainment of the mists with the start gas mist must be prevented before the layer can be free from the mist defects.

SUMMARY OF THE INVENTION

It has now been discovered that the above-mentioned prior art evaporator has a problem to be solved as mentioned hereinbelow.

Conventionally, in order to prevent the entrainment of the mists with the start gas, the flow rate of the carrier gas and/or the flow rate of the liquid raw material are severely and optimally regulated, so that the mists can be completely evaporated in the evaporating chamber. However, the severe and optimal regulation of the flow rates of the carrier gas and liquid raw material are very troublesome, resulting in lowering the productivity of the layer-formation process.

In accordance with an aspect of the present invention, there is provided an evaporator for evaporating mists of liquid raw material to thereby generate start gas for layer-formation. The evaporator includes an evaporator body which has an evaporator chamber defined therein, and a mist supply throat for introducing the mists into the evaporating chamber. The evaporator chamber is defined by a principal evaporating face which opposes to the mist supply throat. The evaporator body further has a start-gas supply passage which is formed therein between the mist supply throat and the principal evaporating face such that the start gas flows out of the evaporating chamber through the start-gas supply passage. A ridge member is provided on an inner side wall surface of the evaporating chamber between the start-gas supply passage and the principal evaporating face so that a tip edge of the ridge member is directed to the principal evaporating face.

The ridge member may be formed as an annular ridge member along a periphery of the inner side wall surface of the evaporating chamber.

Another ridge member may be provided on the inner side wall surface of the evaporating chamber between the start-gas supply passage and the principal evaporating face so that a tip edge of the ridge member is directed to the principal evaporating face. In this case, the ridge members may be arranged so as to be spaced apart from each other. Otherwise, the ridge members may be closely arranged so that no space remains therebetween.

Optionally, a plurality of additional ridge members may be provided on the inner side wall surface of the evaporating chamber between the first-mentioned ridge member and the principal evaporating face so that a tip edge of each of the additional ridge members is directed to the principal evaporating face, and the additional ridge members are arranged by the principal evaporating face.

Preferably, the inner side wall surface of the evaporating chamber is defined as a cylindrical wall surface.

Preferably, the evaporator includes an atomizer for atomizing the liquid raw material with a carrier gas to thereby produce the mists. In this case, the evaporator may further include a raw-material supply conduit for supplying the atomizer with the liquid raw material, and a carrier-gas supply conduit for supplying the atomizer with the carrier gas.

Preferably, the evaporator further includes a plurality of heaters which are provided in the evaporator body so that a temperature in the mist supply throat is higher than a temperature on the principal evaporating face. In this case, a temperature in the evaporating chamber gradually rises from the mist supply throat toward the principal evaporating face.

BRIEF DESCRIPTION OF THE DRAWINGS

The present invention will be more clearly understood from the description set forth below, as compared with the prior art evaporators, with reference to the accompanying drawings, wherein.

DESCRIPTION OF THE PREFERRED EMBODIMENTS

Before description of embodiments of the present invention, for better understanding of the present invention, the prior art evaporators will be explained below.

Figure 1:
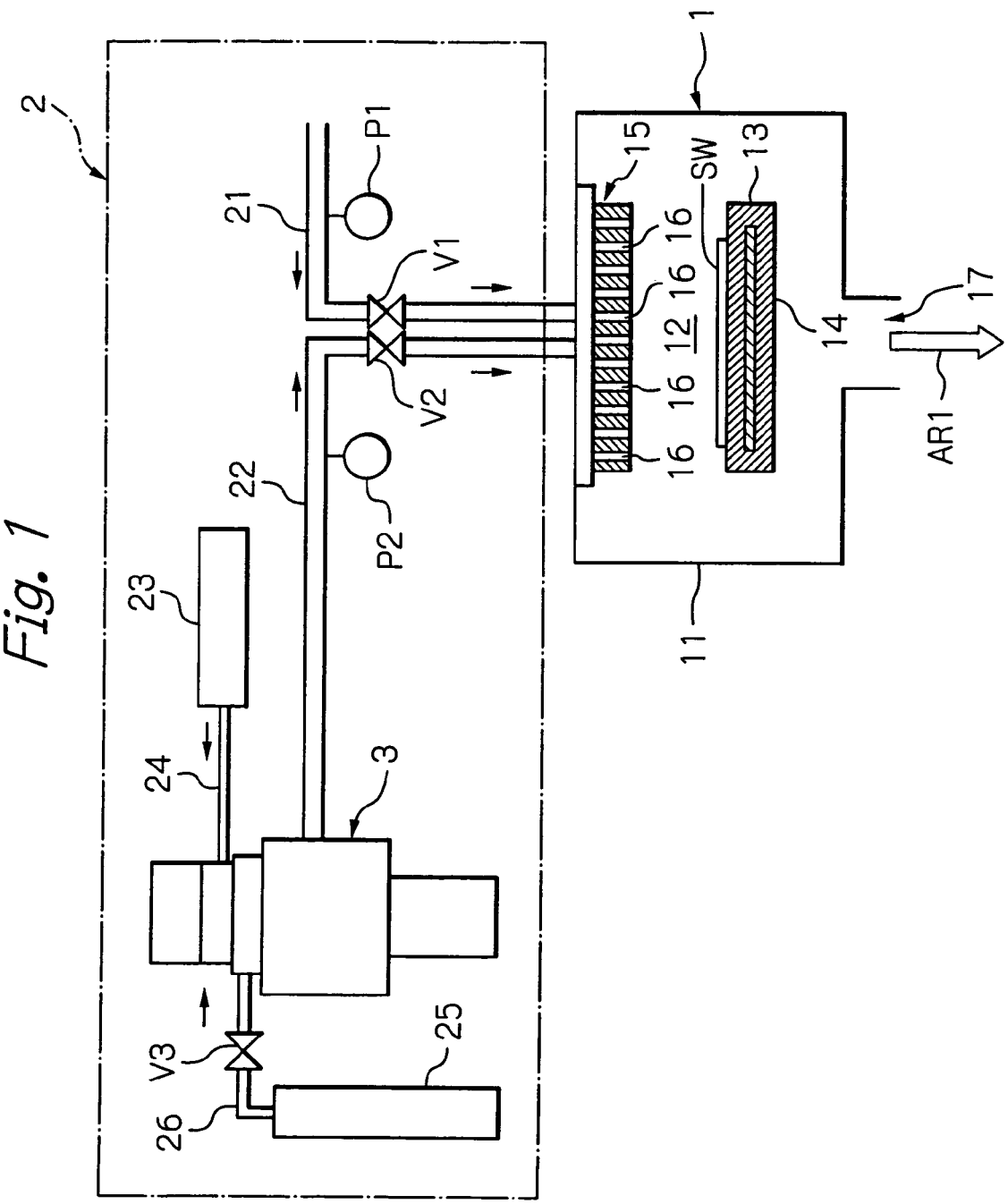
FIG. 1 is a schematic view of both a gaseous-phase layer-formation apparatus and a start-gas supplying apparatus combined with each other.

First, referring to FIG. 1 which is a schematic view of both a gaseous-phase layer-formation apparatus 1 and a start-gas supplying apparatus 2, the layer-formation apparatus 1 is supplied with start gases for layer-formation from the start-gas supplying apparatus 2.

The layer-formation apparatus 1, which may serve as a CVD apparatus, an MOCVD apparatus, an ALD apparatus or the like, includes a vessel 11 defining a processing chamber 12 therein, a wafer rest 13 provided in the processing chamber 12 and containing an electric heater 14, and a shower head 15 provided above the wafer rest 13 and having a plurality of inlet ports 16 formed therein. Also, the vessel 11 has an outlet port 17 connected to an exhaust apparatus (not shown) having a vacuum source. Note, reference SW indicates a semiconductor wafer, such as a silicon wafer or the like, set on the wafer rest 13.

The start-gas supplying apparatus 2 includes a start-gas supply conduit 21 which is connected to a start-gas source (not shown) storing a first start gas, so that the layer-formation apparatus 1 is supplied with the first start gas. The start-gas supply conduit 21 is connected to the shower head 15 so as to be in communication with the inlet ports 16 thereof. The start-gas supply conduit 21 is provided with a pressure controller P1 for controlling the pressure of the first start gas, and a flow control valve V1 for regulating the flow rate of the first start gas.

The start-gas supplying apparatus 2 further includes an evaporator 3 for generating a second start gas. The evaporator 3 is connected to the layer-formation apparatus 1 through a start-gas supply conduit 22 so that the layer-formation apparatus 1 is supplied with the second start gas. The start-gas supply conduit 22 is connected to the shower head 15 so as to be in communication with the inlet ports 16 thereof. The start-gas supply conduit 22 is also provided with a pressure controller P2 for regulating the pressure of the second start gas, and a flow control valve V2 for regulating the flow rate of the second start gas.

The evaporator 3 is connected to a raw material source 23 through a raw-material supply conduit 24. For example, the raw-material source 23 stores a liquid raw material containing a suitable solvent component and an organic metal component, which is used to form a high-k layer exhibiting a high dielectric constant on the semiconductor wafer SW in the layer-formation apparatus 1.

Also, the evaporator 3 is connected to a carrier gas source 25 through a carrier-gas supply conduit 26, and the carrier gas source 25 stores an inert gas as a carrier gas, such as nitrogen gas, argon gas or the like. The carrier-gas supply conduit 26 is provided with a flow control valve V3 for regulating the flow rate of the carrier gas.

The evaporator 3 is supplied with the liquid raw material and the carrier gas from the raw-material source 23 and the carrier gas source 25, and the liquid raw material is atomized with the carrier gas to thereby produce a plurality of fine liquid-phase particles or mists, which are thermally evaporated by the evaporator 3 to thereby generate the second start gas.

In operation, the processing chamber 12 communicates with the vacuum source of the exhaust apparatus (not shown) so that a vacuum state is created in the processing chamber 12. Then, the first start gas and the second start gas are introduced from the respective start-gas supply conduits 21 and 22 through the shower head 15, so that a high-k layer is grown on the semiconductor wafer SW. During the growth of the layer on the semiconductor wafer SW, a pressure in the processing chamber 12 is suitably regulated by the exhaust apparatus (not shown), and waste gases are exhausted from the processing chamber 12 to the outside through the exhaust apparatus (not shown), as represented by an arrow AR1.

For example, when a zirconium oxide ($ZrO_2$) layer is formed as the high-k layer on the semiconductor layer SW, the first start gas is an oxidizer such as oxygen gas containing ozone, water vapors or the like, and the second start gas may be either tetraethylmethylamino zirconium (TEMAZ) gas or tetradiethylamino zirconium (TDEAZ) gas. In this case, the liquid raw material stored in the raw-material source 23 contains a suitable solvent component and either a TEMAZ component or a TDEAZ component as the organic metal component. Of course, for the second start gas, another zirconium-based organic metal gas may be used to form the $ZrO_2$ layer, which may be formed as a silicate layer by using a gas containing silicon.

Also, when a hafnium oxide ($HfO_2$) layer is formed as the high-k layer, the first start gas may be an oxygen gas containing ozone, water vapors or the like, and the second start gas may be tetraethylmethylamino hafnium (TEMAH) gas or tetradiethylamino hafnium (TDEAH) gas. In this case, the liquid raw material stored in the raw-material source 23 contains a suitable solvent component and either a TEMAH component or a TDEAH component as the organic metal component. Of course, another hafnium-based organic metal gas may be used to form the $HfO_2$ layer, which may be formed as a silicate layer by using a gas containing silicon.

Figure 2:
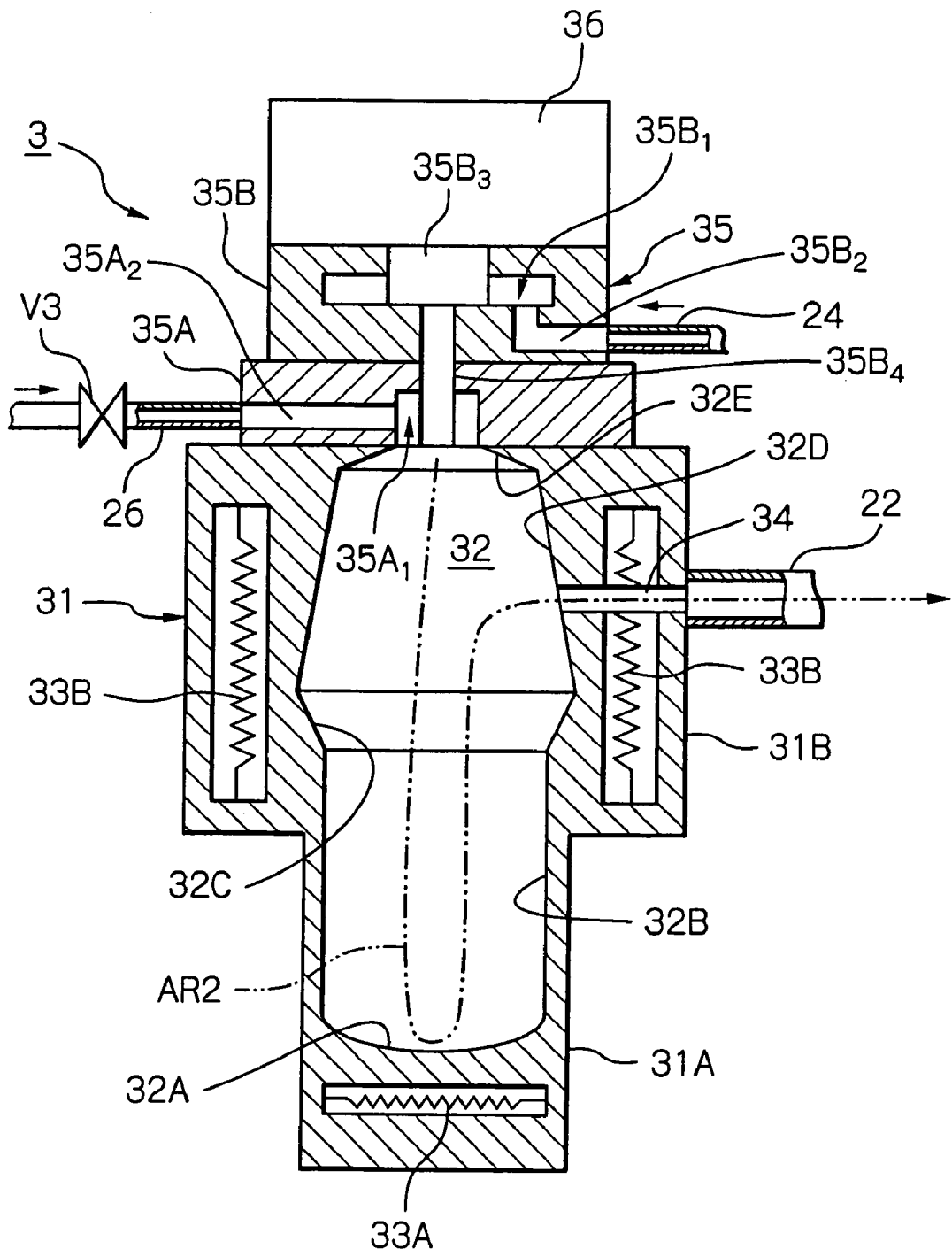
FIG. 2 is a partial cross-sectional view of a prior art evaporator which is used in the start-gas supplying apparatus of FIG. 1.

Next, referring to FIG. 2 which is a partial cross-sectional view of a prior art evaporator as disclosed in JP2005-039120 A, this prior art evaporator may be used as the evaporator 3 of the start-gas supplying apparatus 2 shown in FIG. 1.

The evaporator 3 includes an evaporator body 31 in which an evaporating chamber 32 is defined.

The evaporating chamber 32 is defined by an inner bottom wall surface 32A, a lower cylindrical wall surface 32B extending upwardly from the inner bottom wall surface 32A, a tapered intermediate wall surface 32C extending upwardly from the lower cylindrical wall surface 32B, an upper gradually-tapered wall surface 32D extending upwardly from the tapered intermediate wall surface 32C, and a top tapered wall surface 32E extending upwardly from the upper gradually-tapered wall surface 32D.

Note that the wall surfaces 32B, 32C and 32D define an inner side wall surface of the evaporating chamber 32. Also, note, in the evaporation chamber 32, the top tapered wall surface 32E defines a mist supply throat which opposes to the inner bottom wall surface 32A which serves as a principal evaporating face.

The evaporator body 31 includes a lower portion 31A and an enlarged upper portion 31B integrated with each other. The lower portion 31A has a plurality of electric heaters 33A detachably provided in a bottom wall thereof, and the enlarged upper portion 31B has a plurality of electric heaters 32B detachably provided in a peripheral wall of the enlarged upper portion 33B. Note, in FIG. 2, only one of the electric heaters 33A is representatively shown.

The electric heaters 33A and 33B are controlled so that a heating temperature of the electric heaters 33A is higher than that of the electric heaters 33B, whereby a temperature in the evaporating chamber 32 gradually rises from the mist supply throat, defined by the top tapered wall surface 32E, toward the inner bottom wall surface or principal evaporating face 32A. In short, the principal evaporating face 32A has the maximum temperature.

The evaporator body 31 has a start-gas supply passage 34 formed in the enlarged upper portion 31B thereof. The start-gas supply passage 34 is connected to the start-gas supply conduit 22 (see: FIG. 1).

The evaporator 3 also includes a header unit 35 which is provided on the evaporator body 31. The header unit 35 includes a block member 35A securely mounted on the enlarged upper portion 31B, and a block member 35B securely mounted on the block member 35A.

The block member 35A has an atomizing chamber $35A_1$ defined therein, and a carrier-gas supply passage $35A_2$ communicating with the atomizing chamber $35A_1$ and connected to the carrier-gas supply conduit 26 (see: FIG. 1).

The block member 35B has a plenum chamber $35B_1$ defined therein, and a raw-material supply passage $35B_2$ communicating with the plenum chamber $35B_1$ and connected to the raw-material supply conduit 24 (see: FIG. 1).

Also, the block member 35B has a flow control valve $35B_3$ provided in the plenum chamber $35B_1$, and a nozzle $35B_4$ connected to the flow control value $35B_3$, with the nozzle $35B_4$ being extended through the block members 35B and 35A so that a lower end portion of the nozzle $35B_4$ is lodged in the atomizing chamber $35A_1$ of the block member 35A.

The evaporator 3 further includes a valve controller 36 securely mounted on the block member 35B to control the flow control valve $35B_3$, to thereby regulate the flow rate of the liquid raw material.

In operation, the nozzle $35B_4$ is supplied with the liquid raw material from the raw material source 23 (see: FIG. 1) through the raw-material supply conduit 24, the passage $35B_2$ and the plenum chamber $35B_1$. On the other hand, the atomizing chamber $35A_1$ is supplied with the carrier gas from the carrier gas source (see: FIG. 1) through the carrier-gas supply conduit 26 and the carrier-gas supply passage $35A_2$. Thus, the liquid raw material is atomized with the carrier gas to thereby generate a plurality of fine liquid-phase particles or mists, which are introduced into the evaporating chamber 32 from the mist supply throat defined by the top tapered wall face 32E.

Then, the mists flow downwardly toward the inner bottom wall surface or principal evaporating face 32A, and run against the main evaporating face 32A so as to be upwardly turned, as represented by a double-dot chain arrow AR2 in FIG. 2. Thus, the mists are thermally evaporated due to the existence of the electric heaters 33A and 33B, to thereby generate a second start gas in the evaporating chamber 32. Subsequently, the second start gas is fed to the layer-formation apparatus 1 (see: FIG. 1) through the start-gas supply passage 34 and the start-gas supply conduit 22, as represented by the double-dot chain arrow AR2 in FIG. 2.

In the above-mentioned evaporator 3, a part of the liquid-phase particles or mists may be entrained with the second start gas which is fed to the layer-formation apparatus 1 (see: FIG. 1), so that the entrained mists cause mist defects on a high-k layer formed on the semiconductor wafer SW in the layer-formation apparatus 1. Accordingly, the entrainment of the mists with the second start gas has to be prevented before the high-k layer can be free from the mist defects.

Conventionally, in order to prevent the entrainment of the mists with the second start gas, the flow rate of the carrier gas and/or the flow rate of the liquid raw-material are severely and optimally regulated by the flow control valves V3 and/or $35B_3$, so that the mists can be completely evaporated in the evaporating chamber 32. However, the regulation of the flow rates of the carrier gas and the liquid raw material are very troublesome, resulting in lowering the productivity of the layer-formation process.

Conventionally, when the mists cannot be completely evaporated, it has been thought that the excess mists are suspended in the evaporating chamber 21, and that a part of the excess mists flows into the start-gas supply passage 34, resulting in the entrainment of the mists with the second start gas.

However, according to the inventor's research, it is presumed that the excess mists are diffused on the inner wall surfaces of the evaporating chamber 32. Namely, it is the inventor's presumption that a part of the diffused mists enters the start-gas supply passage 34, resulting in the entrainment of the mists with the second start gas.

Figure 3:
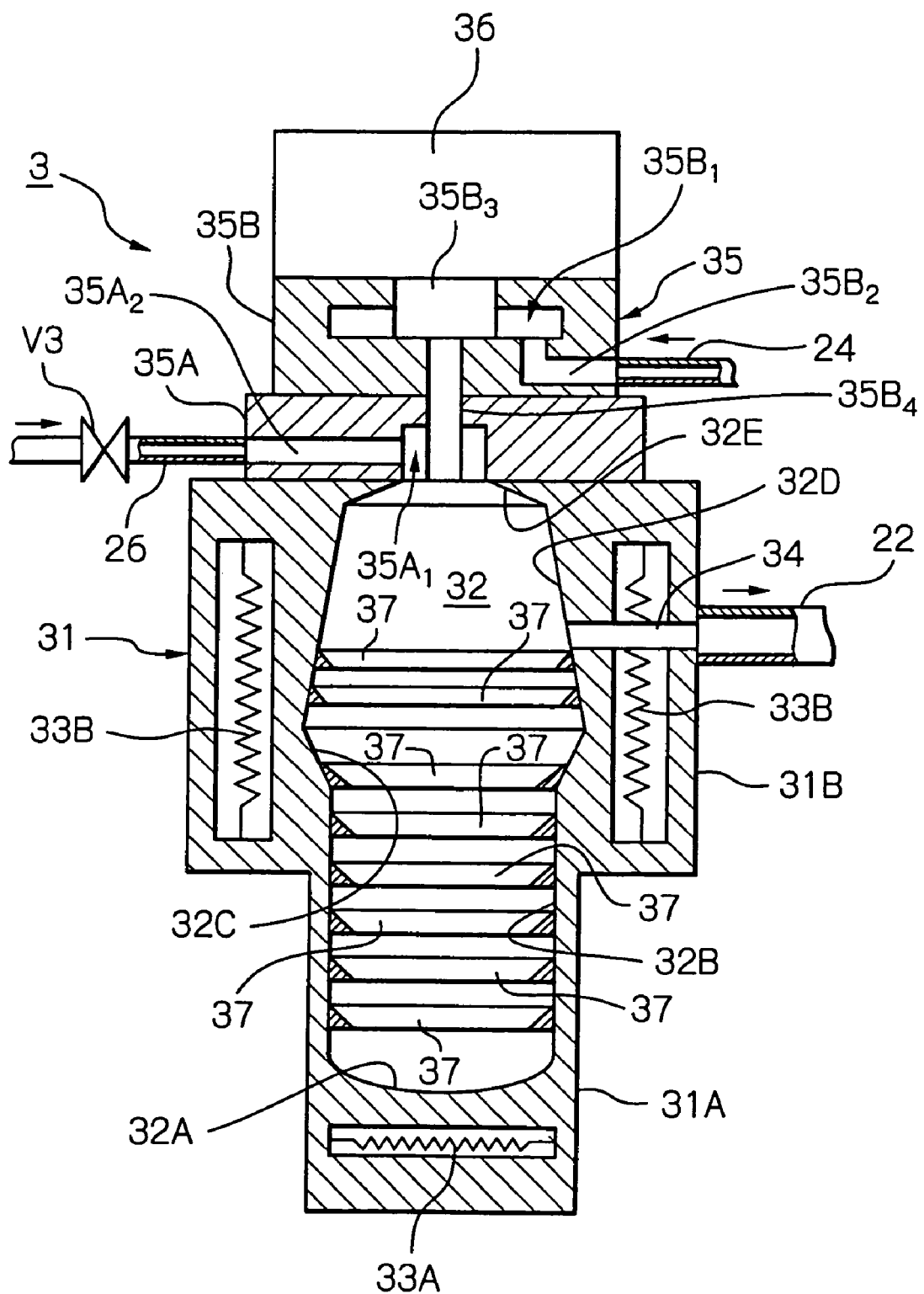
FIG. 3 is a partial cross-sectional view of a first embodiment of the evaporator according to the present invention, which is used in the start-gas supplying apparatus of FIG. 1.

Next, referring to FIG. 3 which is a partial cross-sectional view of a first embodiment of the evaporator according to the present invention, the evaporator may be used as the evaporator 3 of the start-gas supplying apparatus 2 shown in FIG. 1.

The evaporator 3 is substantially identical to the evaporator 3 of FIG. 2 except that a plurality of annular ridge members 37 are securely attached to the wall surfaces 32B, 32C and 32D of the evaporating chamber 32 between the start-gas supply passage 34 and the inner bottom wall surface 32A. Note, each of the annular ridge members 37 may be integrally formed with the evaporator body 31.

Figure 4:
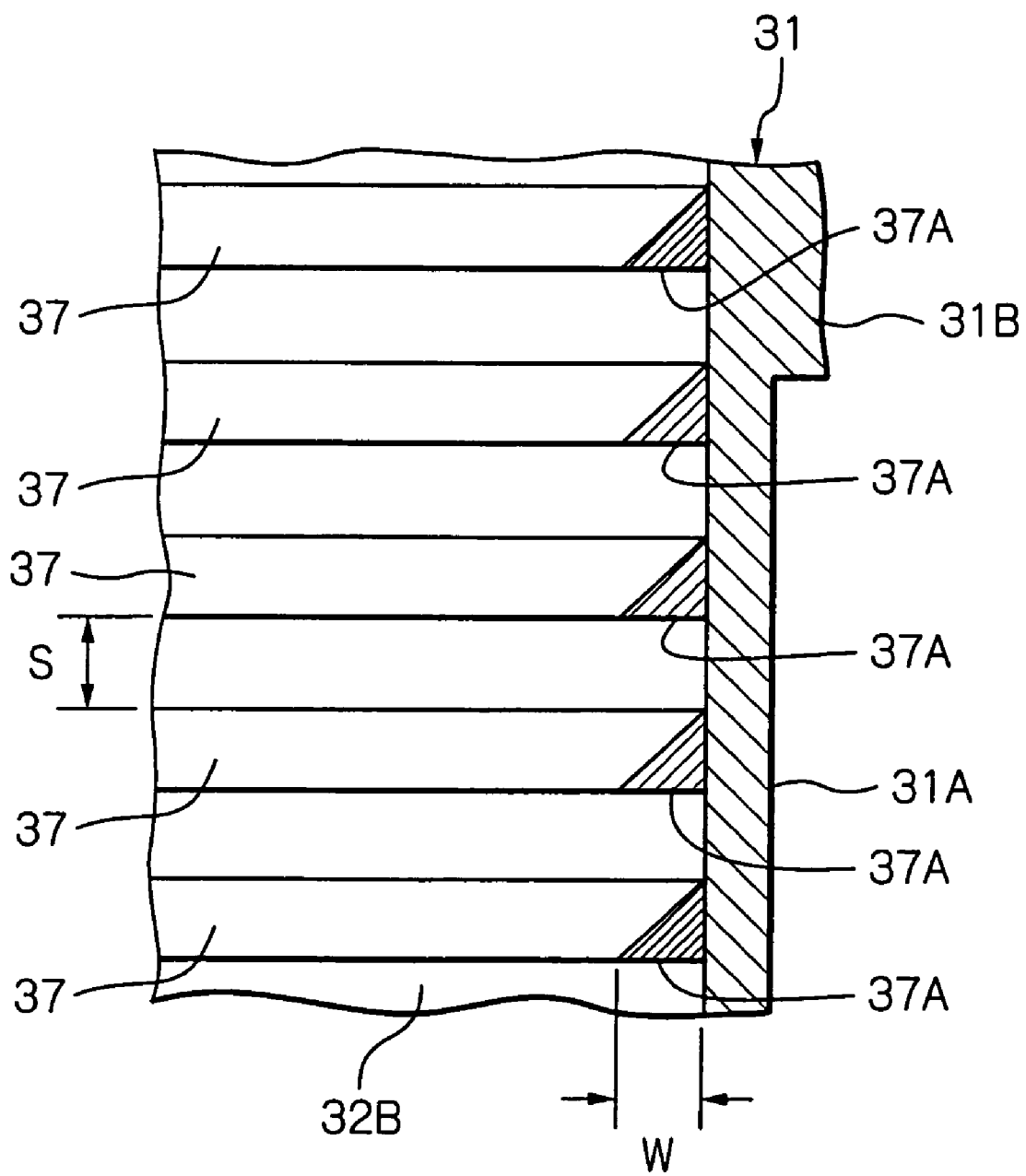
FIG. 4 is an partially-enlarged view showing an arrangement of the annular ridge members of FIG. 3.

As shown in FIG. 4 which is a partially-enlarged view of FIG. 3, each of the annular ridge members 37 has a triangular cross-section, and features an annular dam face 37A which is perpendicularly projected from the lower cylindrical wall surface 32B so that an upward movement of the diffused mists toward the start-gas supply passage 34 is blocked by the annular dam face 37A. The same is true for the annular ridge members 37 securely attached to the tapered intermediate wall surface 32C and the upper gradually-tapered wall surface 32D. Thus, the diffused mists can be prevented from entering the start-gas supply passage 34, so that the mists cannot be entrained with the second start gas.

For example, although each of the annular dam faces 37A may have a width W of 2 mm, and a space S between the two adjacent annular ridge members 37 may be 2 mm, the width W and the space S are variable depending on the size of the evaporating chamber 32. Note that the annular ridge members 37 may be arranged at irregular intervals, if necessary.

As stated above, the inner bottom wall surface or principal evaporating face 32A has a maximum temperature. Accordingly, the provision of the annular ridge members 37 on the lower cylindrical wall surface 32B is preferable because the evaporation of the excess mists, blocked by the annular ridge members 37 of the lower cylindrical wall surface 32B, can be facilitated by the principal evaporating face 32A having the maximum temperature.

Figure 5A:
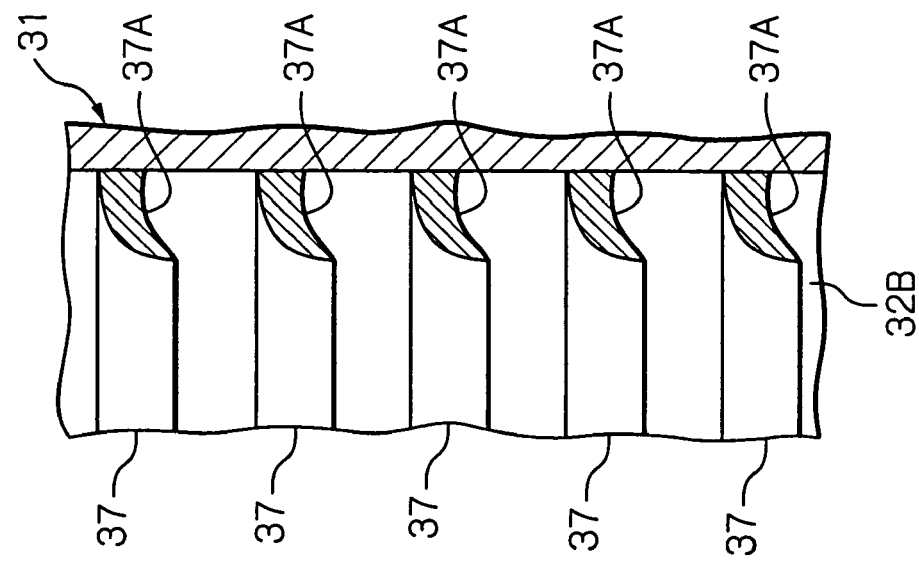
FIG. 5A is a view showing a modification of the arrangement of the annular ridge members of FIG. 4.

As shown in FIG. 5A which shows a modification of the annular ridge members of FIG. 4, the annular ridge members 37 may be closely arranged so that no space remains between the two adjacent annular ridge members 37. In this modification, it is also possible to block the upward movement of the excess mists toward the start-gas supply passage 34 by the annular dam face 37A.

Figure 5B:
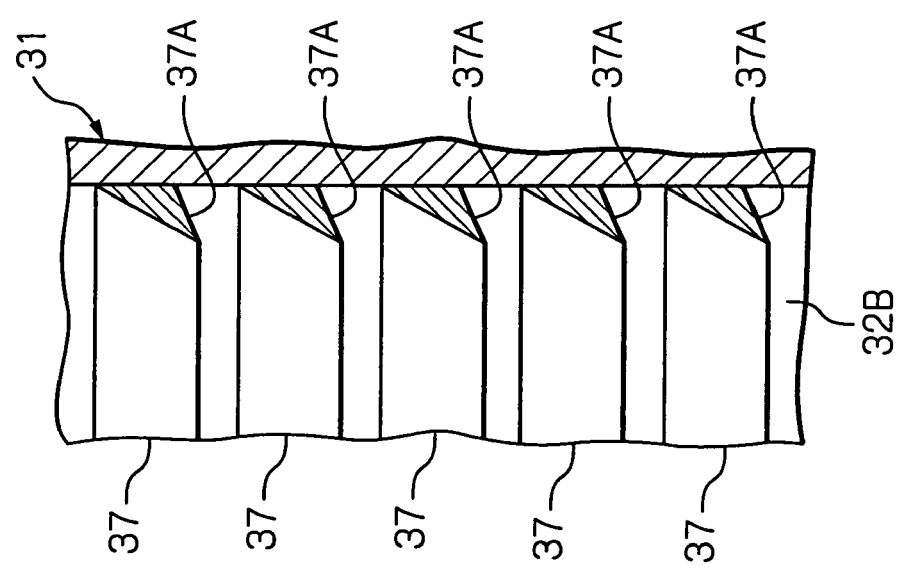
FIG. 5B is a view showing another modification of the annular ridge members of FIG. 4.

Also, as shown in FIG. 5B which shows another modification of the annular ridge members of FIG. 4, each of the annular ridge members 37 may be shaped so that the annular dam face 37A defines an acute angle with respect to the lower cylindrical wall surface 32B, with an annular tip edge of the annular ridge member 27 being directed to the inner bottom surface or principal evaporating face 32A. In this modification, it is also possible to block the upward movement of the excess mists toward the start-gas supply passage 34 by the annular dam face 37A.

Figure 5C:
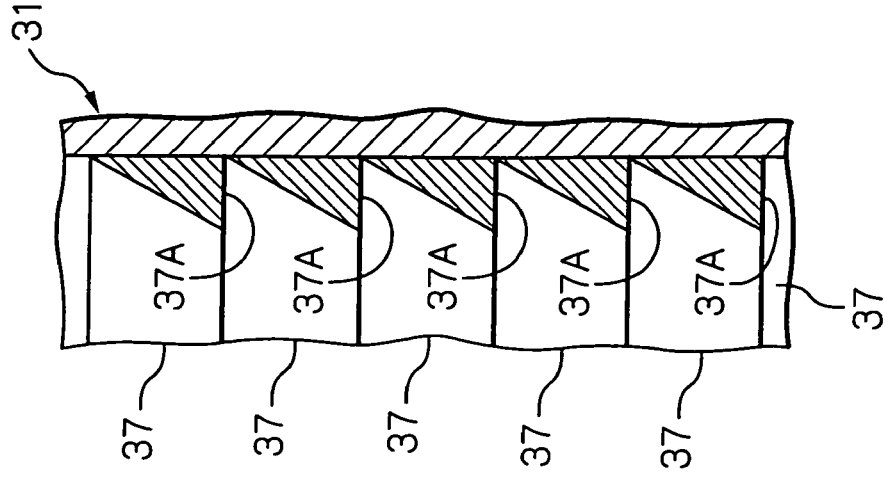
FIG. 5C is a view showing a further modification of the annular ridge members of FIG. 4.

Further, as shown in FIG. 5C which shows a further modification of the annular ridge members of FIG. 4, each of the annular ridge members 37 may have a flipper-like cross section, and the annular dam face 37A is curved so that an annular tip edge of the annular ridge member 27 is directed to the inner bottom surface or principal evaporating face 32A. In this modification, it is also possible to block the upward movement of the excess mists toward the start-gas supply passage 34 by the annular dam face 37A.

The following tests were carried out by the inventor under the conditions (1), (2) and (3):

(1) A liquid raw material containing a suitable solvent component and a TEMAZ component was prepared and stored in the raw material source 23 (see: FIG. 1).

(2) A mixture of Oxygen gas and ozone was used as an oxidizer.

(3) A heating temperature of the electric heaters 33A was set to be 160° C., and a heating temperature of the electric heaters 33B was set to be 100° C. In this case, the temperature, measured at the mist supply throat defined by the top tapered wall surface 32E, fell within the range between about 60° C. and about 80° C.; the temperature, measured in the vicinity of the start-gas supply passage 34, fell within the range between about 100° C. and about 140° C. and the temperature, measured on the inner bottom wall surface or principal evaporating face 32A, fell within the range between about 140° C. and about 160° C.

Using the evaporator 3 of FIG. 3, a $ZrO_2$ layer having a thickness of 10 nm was formed on a silicon wafer in the layer-formation apparatus 1. Then, the $ZrO_2$ layer was inspected by a scanning electron microscope (SEM) and a particle counter, so that no mist defects were found over the $ZrO_2$ layer. Also, although the formation of the 10 nm $ZrO_2$ layers were carried out with respect to one hundred silicon wafers, no mist defect were found on all the 10 nm $ZrO_2$ layers.

On the other hand, using the prior art evaporator 3 of FIG. 2, $ZrO_2$ layers having a thickness of 10 nm were formed on silicon wafers in the layer-formation apparatus 1 under the same conditions as the above-mentioned conditions (1), (2) and (3). In this case, more than 100 mist defects but less than 1000 mist defects were found on the formed 10 nm $ZrO_2$ layers.

The test results support the reasonability of the inventor's presumption that the excess mists are not suspended in the evaporating chamber 32, but the excess mists are diffused on the inner wall surfaces of the evaporating chamber 32.

Figure 6:
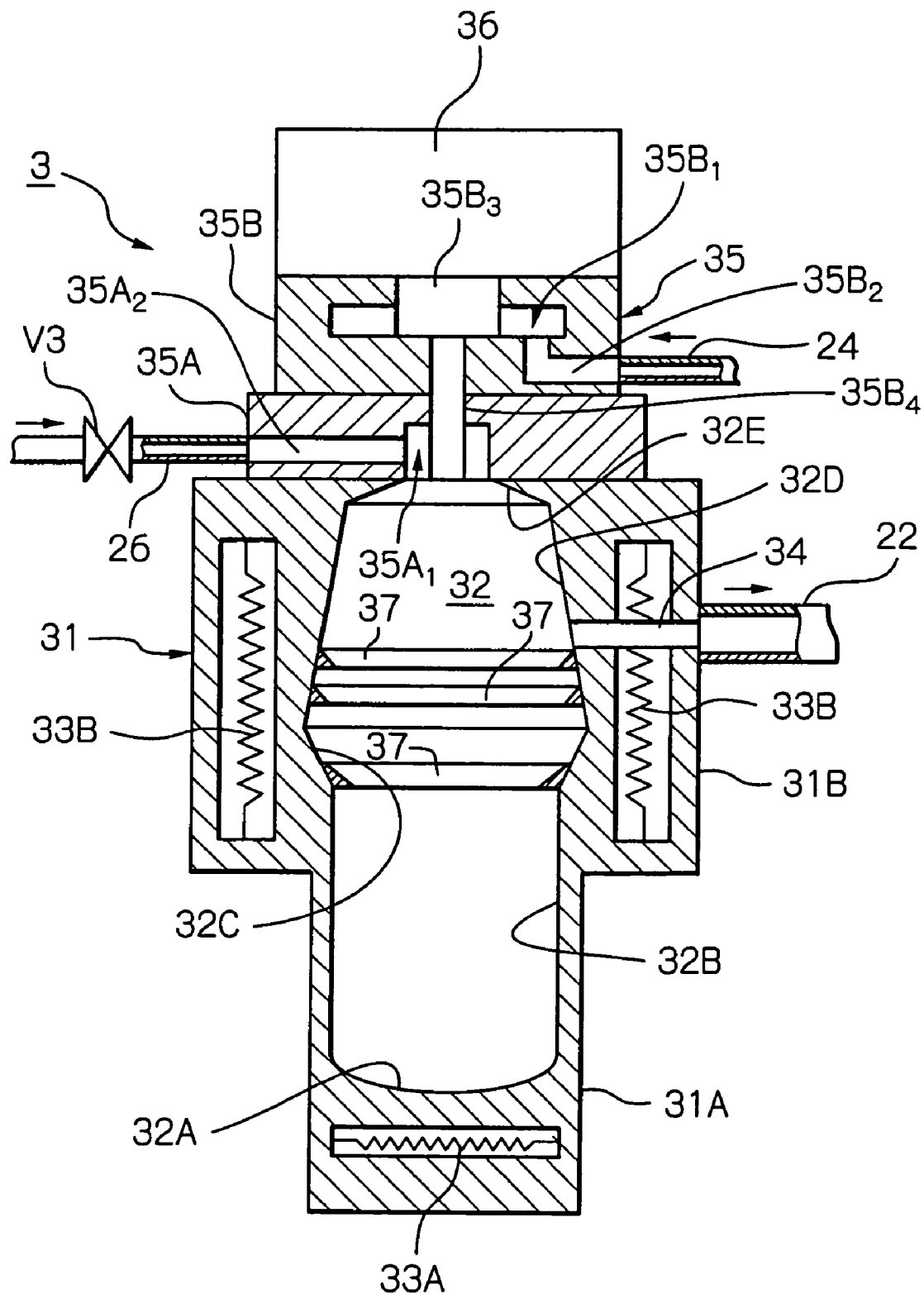
FIG. 6 is a partial cross-sectional view of a second embodiment of the evaporator according to the present invention, which is used in the start-gas supplying apparatus of FIG. 1.

FIG. 6 shows a second embodiment of the evaporator according to the present invention.

As already stated above, although the provision of the annular ridge members 37 on the lower cylindrical wall surface 32B is preferable for the facilitation of the evaporation of the excess mists, the annular ridge members 37 may be eliminated from the lower cylindrical wall surface 32B. In FIG. 6, although the facilitation of the evaporation of the excess mists is retarded, the entrance of the excess mists into the start-gas supply passage 34 can be surely prevented by the annular ridge members 37 provided on both the tapered intermediate wall surface 32C and the upper gradually-tapered wall surface 32D.

In reality, the attachment of the annular ridge members 37 to the cylindrical wall surface 32B or the formation of the annular ridge members 37 on the lower cylindrical wall surface 32B is relatively troublesome, resulting in an increase in production cost of the evaporator. Namely, it is possible to manufacture the evaporator at low cost if the annular ridge members 37 are eliminated from the lower cylindrical wall surface 32B.

Figure 7:
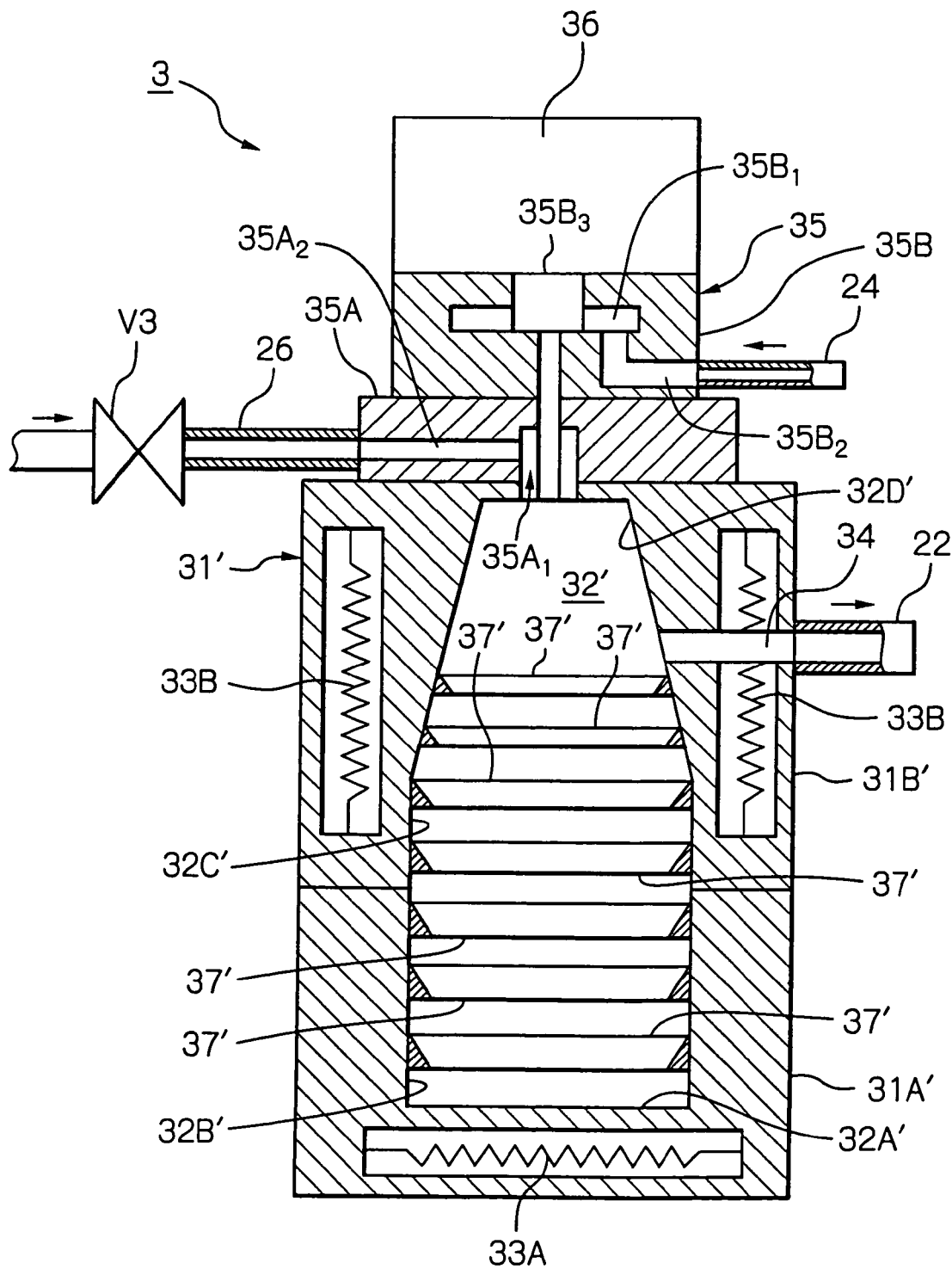
FIG. 7 is a partial cross-sectional view of a third embodiment of the evaporator according to the present invention, which is used in the start-gas supplying apparatus of FIG. 1.

FIG. 7 shows a third embodiment of the evaporator according to the present invention.

In the third embodiment, the evaporator 3 features an evaporator body 31' which includes a lower portion 31A' and an upper portion 31B' having the same diameter. The lower and upper portions 31A' and 31B' are individually manufactured, and then are combined with each other.

The evaporator body 31 has an evaporating chamber 32' formed therein, and the evaporating chamber 32' is defined by an inner bottom wall surface 32A' formed in the lower portion 31A', a cylindrical wall surface formed in the lower portion 32B', a cylindrical wall surface 32C' formed in the upper portion 31B', and a gradually-tapered wall surface 32D' formed in the upper portion 31B'.

Similar to the above-mentioned first embodiment, a plurality of annular ridge members 37' are securely attached to the wall surface 32B' of the lower portion 31A and the wall surfaces 32C' and 32D' of the upper portion 31B. Otherwise, the annular ridge members 37' are integrally formed with the lower portions 31A' and 31B'. Since the lower and upper portions 31A' and 31B' are individually manufactured, the attachment of the annular ridge members 37' to the wall surface 32B' or the formation of the annular ridge members 37' on the wall surface 32B' can be easily carried out. Similarly, the attachment of the annular ridge members 37' to the wall surfaces 32C' and 32D' or the formation of the annular ridge members 37' on the wall surfaces 32C' and 32D' can be easily carried out.

Also, in the third embodiment, the inner bottom wall surface 32A' defines a principal evaporating face, which has a larger area than that of the inner bottom wall surface or principal evaporating face 32A of FIG. 3, because the lower portion 31A' itself can be made larger in comparison with the lower portion 31A of FIG. 3. Thus, it is possible to effectively evaporate the mists in the evaporating chamber 32'.

Figure 8:
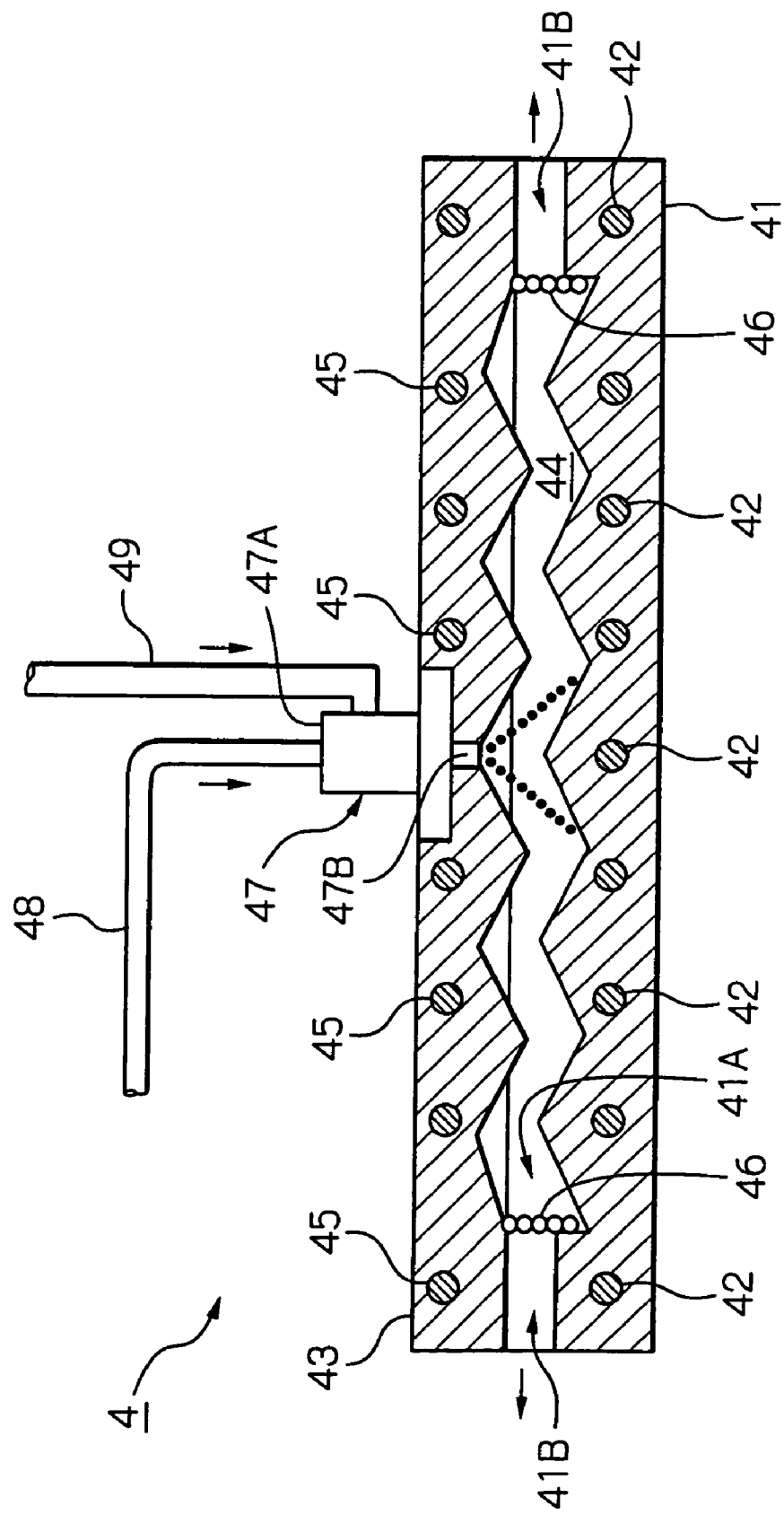
FIG. 8 is a partial cross-sectional view of another prior art evaporator which is used in the start-gas supplying apparatus of FIG. 1.

Referring to FIG. 8 which is a partial cross-sectional view of a prior art evaporator as disclosed in JP-2005-109349 A, the evaporator is indicated by reference numeral 4. The evaporator 4 may be substituted for the evaporator 3 of FIG. 1, and includes a dish-like member 41 having a central circular recess 41A formed therein, and a bottom face of the central circuit recess 41A is defined as a wavy face. The dish-like member 41 also has four radial passages 41B formed in a peripheral section thereof at regular intervals so as to be in communication with the central circular recess 41A. Note, in FIG. 8, only two of the radial passages 41B are visible. The dish-like member 41 is provided with a plurality of electric heaters 42 buried therein.

The evaporator 4 also includes a disk-like member 43 having a central circular wavy face formed thereon, and the disk-like member 43 is combined with the dish-like member 41 so that an evaporating chamber 44 is defined between the wavy bottom face of the central circuit recess 41A and the central circular wavy face of the disk-like member 43, with the radial passages 41B of the dish-like member 41 being closed by a peripheral section of the disk-like member 43. Both the wavy faces are complementary to each other, and the evaporating chamber 44 is defined as a wavy space. The disk-like member 43 is also provided with a plurality of electric heaters 45 buried therein.

Both the dish-like member 41 and the disk-like member 43 have respective mesh filters 46 securely provided at the inner ports of the four radial passages 41B.

The evaporator further includes an atomizer 47 incorporated in the disk-like member 43 at the center thereof. The atomizer 47 has an atomizer body 47A defining an atomizing chamber therein, and a nozzle 47B communicating with the atomizing chamber of the atomizer body 47B, with the nozzle 47B being extended through the disk-like member 43 so as to open on the evaporating chamber 44.

The atomizer body 47A is connected to a raw-material supply conduit 48 and a carrier-gas supply conduit 49. The raw-material supply conduit 48 is connected to a raw material source (not shown) for storing a liquid raw material, and the carrier-gas supply conduit 49 is connected to a carrier gas source (not shown) for storing inert gas.

In operation, the atomizer 47 is supplied with the liquid raw material and the carrier gas from the raw material source and the carrier gas source through the respective conduits 48 and 49, and the liquid raw material is atomized with the carrier gas to thereby produce a plurality of fine liquid-phase particles or mists, and then the mists are introduced into the evaporating chamber 44 through the nozzle 47B. The mist are thermally evaporated by the evaporating chamber 44 to thereby generate a start gas, and the start gas is feed to a layer-formation apparatus (not shown) through the mesh filters 46 and the radial passages 41B.

The wavy faces of the dish-like member 41 and the disk-like member 43 serve as evaporating faces, and each of the wavy evaporating faces features a large area so that it is possible to effectively carry out the evaporation of the mist. Also, an entrance of the mists into the radial passages 41B is prevented by the mesh filters 46.

Although it can be said on first sight that the wavy faces of the dish-like member 41 and the disk-like member 43 are similar to the inner wall surfaces of the evaporating chamber 32 and 32' featuring the annular ridge members 37 and 37', JP-2005-109349 A makes no reference to the diffusion of the mists on the wavy faces of the dish-like member 41 and the disk-like member 43, and it is impossible to block the movement of the diffused mists by the wavy faces of the dish-like member 41 and the disk-like member 43.

Figure 9:
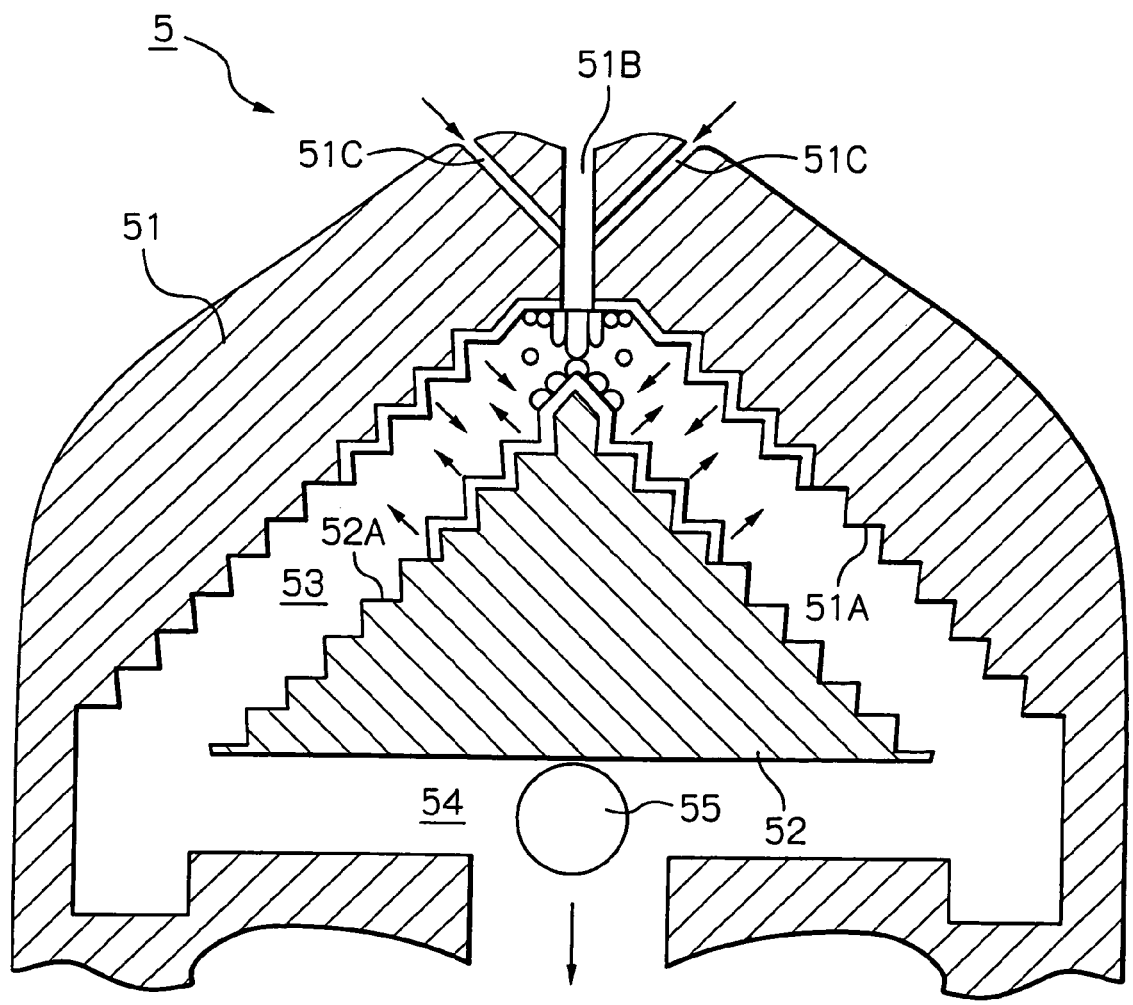
FIG. 9 is a cross-sectional view of yet another prior art evaporator which is used in the start-gas supplying apparatus of FIG. 1.

Referring to FIG. 9 which is a cross-sectional view of another prior art evaporator as disclosed in JP-2001-011634 A, the evaporator is indicated by reference numeral 5. The evaporator 5 may be also substituted for the evaporator 3 of FIG. 1, and includes a block member 51 having a cone-shaped space formed therein, and a cone body 52 placed in the cone-shaped space so as to define an evaporating chamber 53 therebetween. The cone-shaped space of the block member 51 is partially defined by a stepped cone surface 51A, and the cone body 52 features a stepped cone surface 52A. Namely, the evaporating chamber 53 between the stepped cone surfaces 51A and 52B.

Note, although not illustrated, the block member 51 contains electric heaters, and the cone body 52 contains electric heaters.

A space 54 is defined between a bottom surface of the cone-shaped space of the block member 51 and a bottom surface of the cone body 52. The block member 51 has a start-gas outlet port 55 formed therein, and the start-gas outlet port 55 is in communication with the space 54.

The block member 51 has a raw-material supply passage 51B formed therein, and the raw-material supply passage 51B opens on the evaporating chamber 53 at the top of the cone-shaped space of the block member 51. The raw-material supply passage 51 is supplied with a liquid raw material from a raw material source (not shown).

Also, the block member 51 has carrier-gas supply passages 51C formed therein, and each of the carrier-gas supply passages 51C is in communication with the raw-material supply passage 51B. The carrier-gas supply passage 51C is supplied with a carrier gas form a carrier gas source (not shown).

In operation, the liquid raw material is bubbled with the carrier gas in the raw-material supply passage 51B to thereby generate a plurality of bubbles, as symbolically illustrated in FIG. 9.

A part of the bubbles are stuck to the stepped cone surface 51A at the top of the cone-shaped space of the block member 51, and slowly descends as a lamellar stream along the stepped cone surface 51A so that the raw material is thermally evaporated from the lamellar stream to thereby generate a start gas. On the other hand, the remaining part of the bubbles are dropped on and stuck to the top of the stepped cone surface 52A of the cone body 52, and slowly descends as a lamellar stream along the stepped cone surface 52A so that the raw material is thermally evaporated from the lamellar stream to thereby generate a start gas. Note that the evaporation of the raw material is symbolically represented by a plurality of small arrows in FIG. 9. The generated start gas is fed to a layer-formation apparatus (not shown) through the space 54 and the start-gas outlet port 55.

Although it can be said on first sight that the stepped cone surfaces 51A and 52A are similar to the inner wall surfaces of the evaporating chamber 32 and 32' featuring the annular ridge members 37 and 37', JP-2001-011634 A makes no reference to the diffusion of the mists on the stepped cone surfaces 51A and 52A, and it is impossible to block the movement of the diffused mists by the stepped cone surfaces 51A and 52A.

In the above-mentioned embodiment, although the principal evaporating face (32A, 32A') is defined as the bottom wall surface of the evaporating chamber (32, 32'), there may be a case where the principal evaporating face is not defined as the bottom wall surface. In particular, the principal evaporating face is defined as a wall surface of the evaporating chamber, which opposes to the mist supply throat. Accordingly, for example, when the mist supply throat is formed in a side wall surface of the evaporating chamber, the principal evaporating face is defined as another side wall surface which opposes to the aforesaid side wall surface.

Finally, it will be understood by those skilled in the art that the foregoing description is of preferred embodiments of the evaporators, and that various changes and modifications may be made to the present invention without departing from the spirit and scope thereof.

The invention claimed is:

1. An evaporator for evaporating mists of liquid raw material to thereby generate start gas for layer-formation, the evaporator comprising:

an evaporator body having an evaporator chamber defined therein, and a mist supply throat for introducing a mists into said evaporating chamber, said evaporator chamber being defined by a principal evaporating face which opposes to said mist supply throat, said evaporator body further having a start-gas supply passage which is formed therein between said mist supply throat and said principal evaporating face so that the start gas flows out of said evaporating chamber through said start-gas supply passage; and a ridge member provided on an inner side wall surface of said evaporating chamber between said start-gas supply passage and said principal evaporating face so that a tip edge of said ridge member is directed to said principal evaporating face,
wherein the ridge member is adapted to block a movement of the mist from the principal evaporating face towards the start-gas supply passage.

2. The evaporator as set forth in claim 1, wherein said ridge member is formed as an annular ridge member along a periphery of the inner side wall surface of said evaporating chamber.

3. The evaporator as set forth in claim 1, further comprising another ridge member provided on the inner side wall surface of said evaporating chamber between said start-gas supply passage and said principal evaporating face so that a tip edge of said ridge member is directed to said principal evaporating face, said ridge members being arranged so as to be spaced apart from each other.

4. The evaporator as set forth in claim 1, further comprising another ridge member provided on the inner side wall surface of said evaporating chamber between said start-gas supply passage and said principal evaporating face so that a tip edge of said ridge member is directed to said principal evaporating face, said ridge members being closely arranged so that no space remains therebetween.

5. The evaporator as set forth in claim 1, further comprising a plurality of additional ridge members provided on the inner side wall surface of said evaporating chamber between said first-mentioned ridge member and said principal evaporating face so that a tip edge of each of said additional ridge members is directed to said principal evaporating face, said additional ridge members being arranged by said principal evaporating face.

6. The evaporator as set forth in claim 1, wherein the inner side wall surface of said evaporating chamber is defined as a cylindrical wall surface.

7. The evaporator as set forth in claim 1, further comprising an atomizer for atomizing the liquid raw material with a carrier gas to thereby produce the mists.

8. The evaporator as set forth in claim 7, further comprising:
a raw-material supply conduit for supplying said atomizer with the liquid raw material; and
a carrier-gas supply conduit for supplying said atomizer with the carrier gas.

9. The evaporator as set forth in claim 1, further comprising a plurality of heaters which are provided in said evaporator body so that a temperature in said mist supply throat is higher than a temperature on said principal evaporating face.

10. The evaporator as set forth in claim 1, further comprising a plurality of heaters which are provided in said evaporator body so that a temperature in said evaporating chamber gradually rises from said mist supply throat toward said principal evaporating face.

11. The evaporator as set forth in claim 1, wherein the liquid raw material contains an organic metal component.

12. The evaporator as set forth in claim 1, wherein said evaporator is used in a layer-formation apparatus.

13. The evaporator as set forth in claim 12, wherein a formation of an oxide layer comprising at least one of zirconium and hafnium is carried out in said layer-formation apparatus.

14. The evaporator as set forth in claim 1, wherein the ridge member further comprises an annular dam face.

15. The evaporator as set forth in claim 14, wherein the annular dam face perpendicularly projects from the inner side wall surface of said evaporating chamber.

16. The evaporator as set forth in claim 14, wherein the annular dam face has a width of approximately 2 mm.

17. The evaporator as set forth in claim 1, wherein the evaporation chamber further comprises:
a lower cylindrical wall surface;
an upper tapered wall surface; and
a tapered intermediate wall surface between the lower cylindrical wall surface and the upper tapered wall surface,
wherein the ridge member is attached to at least one of the lower cylindrical wall surface, the upper tapered wall surface, and the tapered intermediate wall surface.

18. The evaporator as set forth in claim 17, wherein the ridge member is attached to at least one of the upper tapered wall surface, and the tapered intermediate wall surface.

19. An evaporator, comprising:
an evaporator body having an evaporator chamber, the evaporator chamber comprising:
a principal evaporating face;
a lower cylindrical wall surface connected to the principal evaporating face;
an upper tapered wall surface; and
a tapered intermediate wall surface between the lower cylindrical wall surface and the upper tapered wall surface,
wherein an annular ridge member adapted to block a movement of a mist from the principal evaporating face towards a start-gas supply passage is attached to at least one of the lower cylindrical wall surface, the upper tapered wall surface, and the tapered intermediate wall.

20. An evaporator, comprising:
an evaporator body having an evaporator chamber, the evaporator chamber comprising:
a principal evaporating face;
a lower cylindrical wall surface connected to the principal evaporating face;
an upper tapered wall surface; and
a tapered intermediate wall surface between the lower cylindrical wall surface and the upper tapered wall surface,
wherein an annular ridge member is attached across a width of an at least one of the lower cylindrical wall surface, the upper tapered wall surface, and the tapered intermediate wall, and
wherein the annular ridge member is adapted to prevent a movement of a mist from the principal evaporating face towards a start-gas supply passage located at the upper tapered wall surface.

* * * * *